(12) United States Patent
Chang et al.

(10) Patent No.: US 6,384,346 B1
(45) Date of Patent: May 7, 2002

(54) TRACE LAYOUT OF A PRINTED CIRCUIT BOARD WITH AGP AND PCI SLOTS

(75) Inventors: Nai-Shung Chang, Junghe; Ching-Fu Chuang, Taipei; Hsiu-Wen Ho, Shinjuang; Chia-Hsing Yuo, Sanchung; Shu-Hui Chen, Taipei, all of (TW)

(73) Assignee: Via Technologies, Inc., Taipei (TW)

(*) Notice: Subject to any disclaimer, the term of this patent is extended or adjusted under 35 U.S.C. 154(b) by 6 days.

(21) Appl. No.: 09/688,037

(22) Filed: Oct. 12, 2000

(30) Foreign Application Priority Data

Oct. 14, 1999 (TW) .......................................... 088217418

(51) Int. Cl.[7] .............................................. H01R 9/09
(52) U.S. Cl. ...................... 174/261; 361/777; 174/260; 174/780; 174/785; 174/794
(58) Field of Search .................................. 174/260, 261, 174/250; 361/777, 778, 779, 780, 782, 783, 785, 788, 791, 794, 795

(56) References Cited

U.S. PATENT DOCUMENTS

| | | | | |
|---|---|---|---|---|
| 5,991,833 A | * | 11/1999 | Wandler et al. | |
| 6,145,029 A | * | 11/2000 | Deschepper et al. | |
| 6,289,405 B1 | * | 9/2001 | Movall et al. | |
| 6,301,104 B1 | * | 10/2001 | Hu | |
| 2001/0001878 A1 | * | 5/2001 | Issac et al. | |

* cited by examiner

*Primary Examiner*—Kamand Cuneo
(74) *Attorney, Agent, or Firm*—Rabin & Berdo, P.C.

(57) ABSTRACT

A trace layout of a printed circuit board (PCB) is provided with a north bridge, at least a peripheral component interconnect (PCI) slot, and an accelerate graphics port (AGP) slot. The PCB includes at least a first trace layer and a second trace layer under the first trace layer. The AGP slot is mounted between the north bridge and the PCI slot. The PCB further includes a number of first traces, and a number of second traces. The first traces are used for connecting the north bridge to the PCI slot while the second traces are used to connect the north bridge to the AGP slot. Some of the first traces are on the second trace layer under the AGP slot, while the other of the first traces are on the first trace layer or the second trace layer and trace aside the AGP slot. Most of the second traces are on the first trace layer and the other of the second traces are on the second trace layer.

14 Claims, 2 Drawing Sheets

TRACE LAYOUT OF A PRINTED CIRCUIT BOARD WITH AGP AND PCI SLOTS

This application incorporates by reference Taiwanese application Ser. No. 88217418, filed Oct. 14, 1999.

BACKGROUND OF THE INVENTION

1 Field of the Invention

The invention herein relates in general to a trace layout of a printed circuit board (PCB) and more particularly to a PCB provided with an accelerate graphics port (AGP) slot and a peripheral component interconnect (PCI) slot, wherein the AGP and PCI traces can be effectively laid out.

2. Description of the Related Art

Referring to FIG. 1, which shows a conventional trace layout of a PCB with the AGP and PCI traces, including a central processing unit (CPU) slot 100, a north bridge 110, an AGP slot 120, four PCI slots 130, and a south bridge 140. The north bridge 110 and the south bridge 140 are both intelligent control chipsets. The north bridge 110 is mainly connected to devices which process data at high data rate and high efficiency while the south bridge 140 is connected to peripheral devices functioning at low data rate. In the conventional trace layout, the AGP slot 120 is located between the PCI slots 130 and the north bridge 110. The north bridge 110 is directly connected to the AGP slot 120 by the AGP traces 150 (150A and 150B). As shown in FIG. 1, the PCI traces 160 (160A and 160B) connecting the north bridge 110 to the south bridge 140 is designed to trace aside the AGP slot 120, pass through the PCI slots 130, and finally connect to the south bridge 140.

Conventionally, the PCB has a multi-layer structure composed of a component layer, a ground layer, a power layer, and a solder layer. As mentioned above and depicted in FIG. 1, the AGP traces 150 further includes traces 150A (real lines) which are distributed on the component layer and traces 150B (dotted lines) which are distributed on the solder layer. Similarly, the PCI traces 160 are composed of traces 160A (real lines) which are distributed on the component layer and traces 160B (dotted lines) which are distributed on the solder layer. However, the above-mentioned trace layout of PCB, spatial utilization has been optimized such that miniaturization of the PCB size is impossible.

SUMMARY OF THE INVENTION

It is therefore an object of the invention to provide a trace layout of a PCB, wherein the trace layout flexibility is increased significantly. By modifying the trace layout for the AGP and PCI traces, the gap between the AGP slot and the CPU slot can be reduced. As a result, the size and the cost of the PCB can be reduced while the efficiency of the whole PCB is still preserved.

In order to accomplish the object of the invention, the invention provides a trace layout of a PCB. The PCB, including at least a first trace layer and a second trace layer under the first trace layer, is provided with a north bridge, at least a PCI slot, and an AGP slot. The AGP slot is mounted between the north bridge and the PCI slot. The PCB further includes a number of first traces for connecting the north bridge to the PCI slot, and a number of second traces for connecting the north bridge to the AGP slot. Some of the first traces are distributed on the second trace layer under the AGP slot and trace aside the AGP high-frequency signal differential pairs. The differential pairs include the first address/data strobe differential pair (AD_STB0 and -AD_STB0), the second address/data strobe differential pair (AD_STB1 and -AD_STB1), and the side-band strobe differential pair (SB_STB and -SB_STB). The other of the first traces are on the first trace layer or the second trace layer and trace aside the AGP slot. Most of the second traces are on the first trace layer, and only the other of the second traces are on the second trace layer. In the above mentioned trace layout, the gap of the traces between the CPU and AGP slots can either be reduced or the reserved space can be further used for placement of other devices. The cost effectiveness of the whole PCB is then improved.

In order to accomplish the object of the invention, the invention further provides a trace layout of a PCB. The PCB, including at least a first trace layer and a second trace layer under the first trace layer, is provided with a control chipset, at least a bus slot, and a fast processing chip slot. The fast processing chip slot is located between the control chipset and the bus slot. The PCB further includes a number of first traces and a number of second traces. The first traces are used to connect the control chipset to the bus slot. Some of the first traces are on the second trace layer and under the fast processing chip slot, while the other of the first traces are on the first trace layer or the second trace layer and trace aside the fast processing chip slot. The second traces are used to connect the control chipset to the fast processing chip slot. Most of the second traces are on the first trace layer, and the other of the second traces are on the second trace layer. The cost effectiveness of the PCB is then improved.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 2:
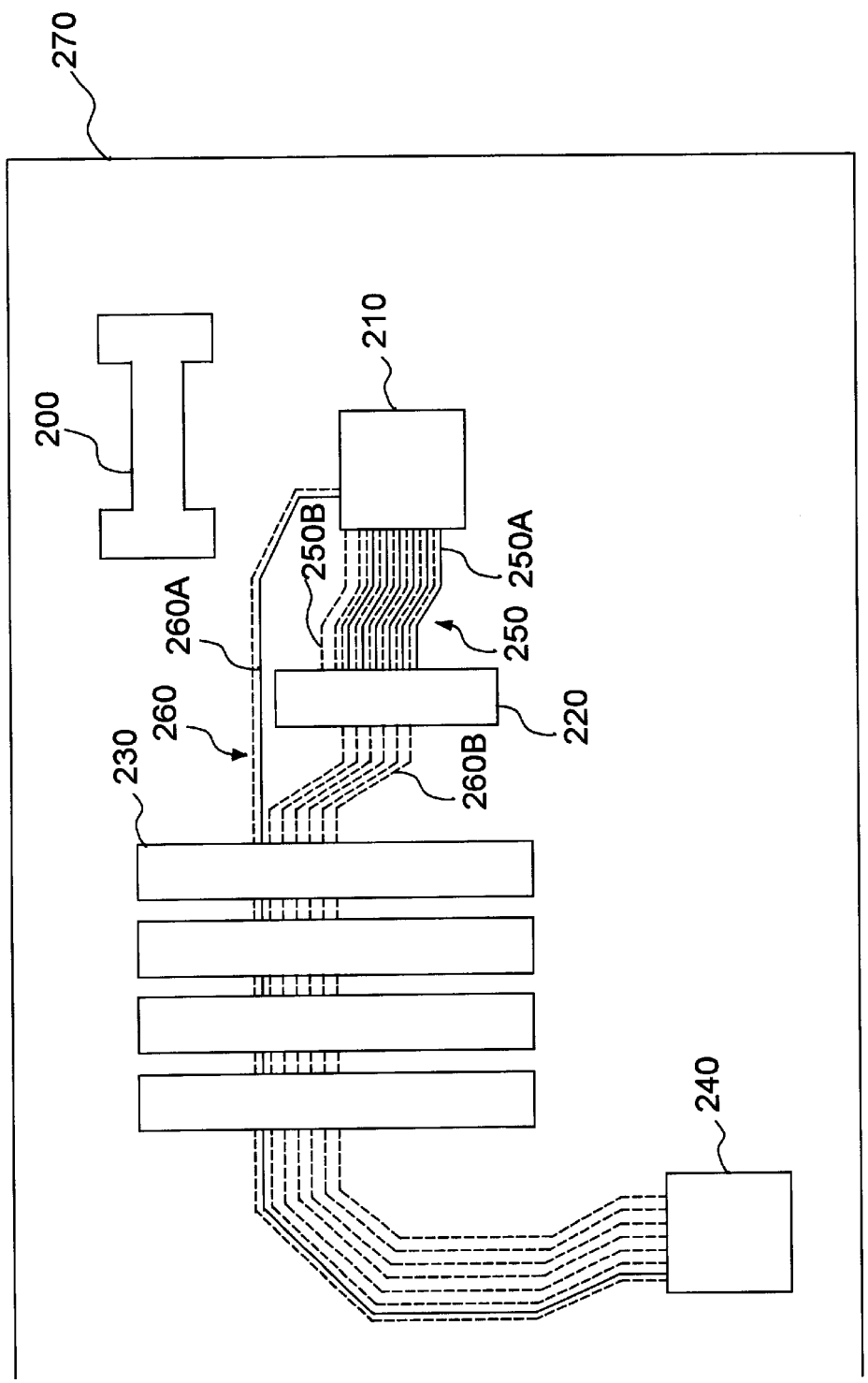
FIG. 2 is a diagram showing a preferred embodiment of the trace layout of a PCB according to the invention.

Referring to FIG. 2, which shows a preferred embodiment of the trace layout of a PCB according to the invention. In the embodiment, the PCB, composed of at least one component layer in addition to a solder layer, is provided with a CPU slot 200, a north bridge 210, an AGP slot 220, four PCI slots 230, and a south bridge 240. The CPU slot 200 can, but not limited to, be either Slot-1 or Socket-7.

As shown in FIG. 2, the second traces 250 connecting the north bridge 210 to the AGP slot 220 are mainly distributed on the component layer denoted by 250A and symbolized by real lines, while only a small part of the second traces 250 are located on the solder layer denoted by 250B and symbolized by dotted lines. The unoccupied space on the solder layer is used for placement of first traces 260 which connect the north bridge 210 to the PCI slots 230. Therefore, some of the first traces 260 labeled 260B and symbolized by dotted lines, are located on the solder layer, trace under the AGP slot 220 and then connect to the PCI slot. Only a small portion of the first traces 260 labeled 260A and depicted as real lines, trace aside the AGP slot 220, pass through the PCI slot 230 and then connect to the south bridge 240.

Since the number of the first traces 260A is decreased, the gap between the AGP slot 220 and the CPU slot 200 can be further reduced, thereby increasing the trace layout flexibility. As a result, the size and the cost of the PCB can be reduced.

Figure 1:
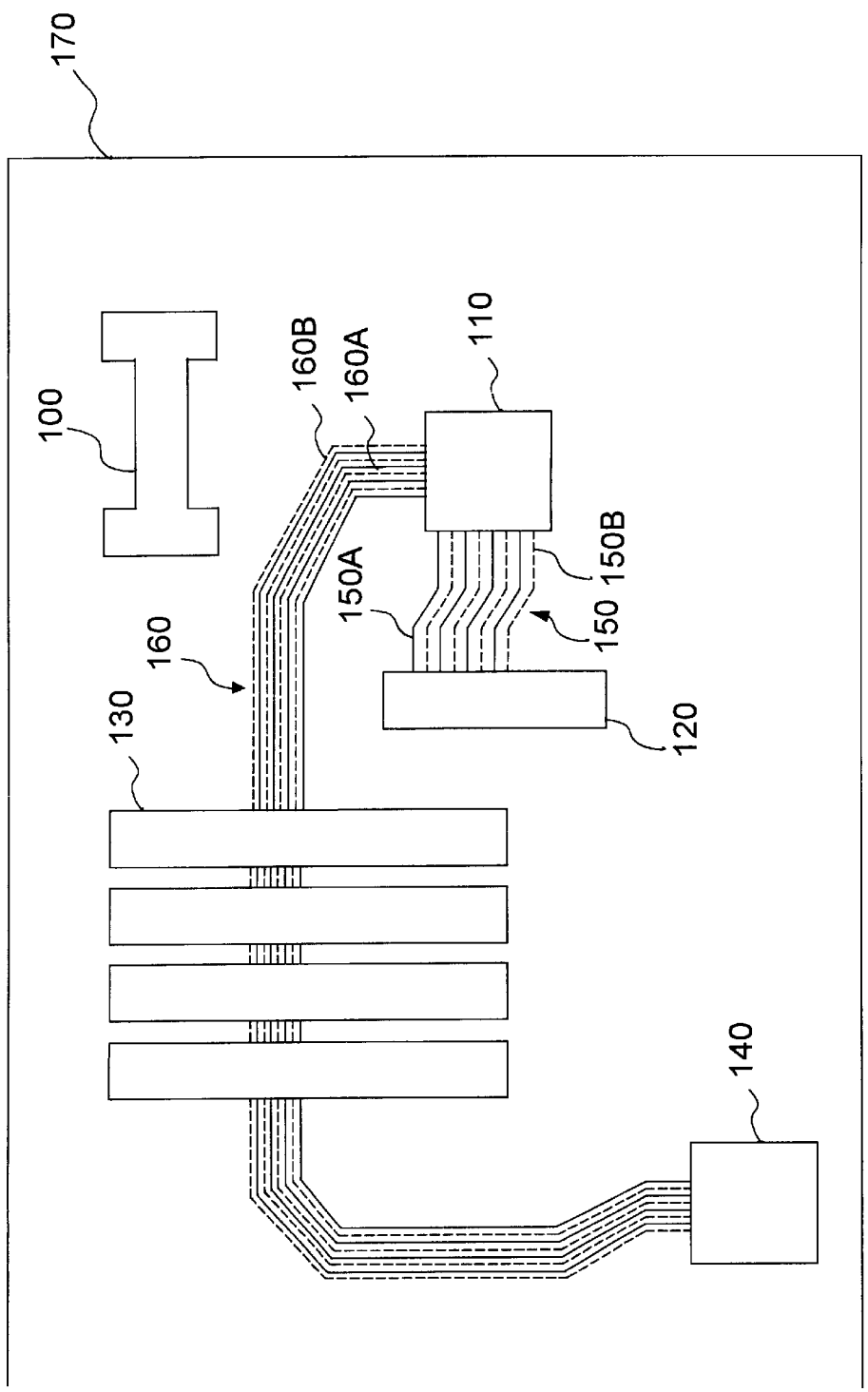
FIG. 1 (PRIOR ART) is a simplified diagram showing the conventional trace layout of a PCB with the PCI and AGP traces.

According to the preferred embodiment, some traces connecting to the PCI slots, originally tracing aside the AGP slot (FIG. 1), are altered to trace under the AGP slot and then connect to the PCI slot (FIG. 2). As a result, these traces are close to the traces connecting to the AGP slot which will result in higher signal noise. The signal noise produced thereby must be diminished first. As a solution, the traces that trace under the AGP slot and then connect to the PCI slots are designed to be vertical to the pins of the AGP slot since signal noise produced by this design will be much lower than that if the traces are horizontal to the pins. It is noted that careful consideration must be taken so that the PCB should be kept away from region with higher-frequency signals as they trace under the AGP slot. Higher-frequency signals are, for example, the first address/data strobe differential pair (AD_STB0 and - AD_STB0), the second address/data strobe differential pair (AD_STB1 and - AD_STB1), and the side-band strobe differential pair (SB_STB and - SB_STB). By the above-mentioned design, the signal noise can be reduced effectively.

In the above-mentioned embodiment, the north bridge, the PCI slots, and the AGP slot are taken as a specific example. However, the present invention is not limited thereto. For example, the north bridge can be replaced by another control chipset, the PCI slot can be substituted by a bus slot, and the AGP slot can be exchanged for a fast processing chip slot, wherein the fast processing chip slot is mounted between the control chipset and the bus slot. The main object of the invention is accomplished by designing a number of traces connecting the control chipset to the bus slot on the solder layer under the fast processing chip slot, while the remaining are located either on the solder or the component layer, but tracing aside the fast processing chip slot.

The characteristics of the invention are as follows:

Most traces connected to the PCI slots are located on the solder layer and trace under the AGP slot while only a small number are located on the component layer or the solder layer and trace aside the AGP slot. The trace layout space of the PCB can be utilized efficiently by reducing the space between the AGP and PCI slots. Thus, the trace layout flexibility of the PCB is increased, resulting in a reduction in the size and the cost of the PCB.

While the invention has been described by way of example and in terms of a preferred embodiment, it is to be understood that the invention is not limited thereto. On the contrary, it is intended to cover a variety of modifications and similar arrangements and procedures, and the scope of the appended claims therefore should be accorded the broadest interpretation so as to encompass all such modifications and similar arrangements and procedures.

What is claimed is:

1. A trace layout of a printed circuit board (PCB), wherein the PCB comprises at least a first trace layer and a second trace layer under the first trace layer; there are a north bridge, at least a peripheral component interconnect (PCI) slot and an accelerate graphics port (AGP) slot located on the PCB; and the AGP slot is located between the north bridge and the PCI slot, the trace layout comprising:

a plurality of first traces, for connecting the north bridge and the PCI slot, wherein the first traces are under the AGP slot on the second trace layer.

2. The trace layout according to claim 1, further comprising:

a plurality of second traces, for connecting the north bridge and the PCI slot, wherein the second traces are on the first trace layer or the second trace layer and trace aside the AGP slot.

3. The trace layout according to claim 1, further comprising:

a plurality of third traces, for connecting the north bridge and the AGP slot, wherein most of the third traces are on the first trace layer, and the other of the third traces are on the second trace layer.

4. The trace layout according to claim 1, wherein the AGP slot further comprises a plurality of AGP high-frequency signal differential pairs, and the first traces trace aside the AGP high-frequency signal differential pairs.

5. The trace layout according to claim 4, wherein the AGP high-frequency signal differential pairs at least comprise:

a first address/data strobe differential pair (AD_STB0 and - AD_STB0);

a second address/data strobe differential pair (AD_STB1 and - AD_STB1); and a side-band strobe differential pair (SB_STB and - SB_STB).

6. The trace layout according to claim 1, wherein the first trace layer is a component layer.

7. The trace layout according to claim 1, wherein the second trace layer is a solder layer.

8. A trace layout of a PCB, wherein the PCB comprises at least a first trace layer and a second trace layer under the first trace layer, there are a control chipset, at least a first bus slot and a second bus slot located on the PCB; and the second bus slot is located between the control chipset and the first bus slot, the trace layout comprising:

a plurality of first traces, for connecting the control chipset and the first bus slot, wherein the first traces are on the second trace layer under the second bus slot.

9. The trace layout according to claim 8, further comprises:

a plurality of second traces, for connecting the control chipset and the bus slot, wherein the second traces are on the first trace layer or the second trace layer and trace aside the second bus slot.

10. The trace layout according to claim 8, further comprises:

a plurality of third traces, for connecting the control chipset and the second bus slot, wherein most of the third traces are on the first trace layer, and the other of the third traces are on the second trace layer.

11. The trace layout according to claim 8, wherein the transmitting frequency of the second bus slot $\geq 66$ MHz.

12. The trace layout according to claim 8, wherein the control chipset is a north bridge.

13. The trace layout according to claim 8, wherein the first bus slot is a PCI slot.

14. The trace layout according to claim 8, wherein the second bus slot is an AGP slot.

* * * * *